United States Patent [19]

Ito et al.

[11] Patent Number: 5,354,445
[45] Date of Patent: Oct. 11, 1994

[54] THIN FILM-FORMING APPARATUS

[75] Inventors: Hiroki Ito; Naoyuki Kajita, both of Amagasaki, Japan

[73] Assignee: Mitsubishi Denki Kabushiki Kaisha, Tokyo, Japan

[21] Appl. No.: 95,046

[22] Filed: Jul. 22, 1993

Related U.S. Application Data

[63] Continuation of Ser. No. 806,326, Dec. 13, 1991, abandoned.

[30] Foreign Application Priority Data

Dec. 19, 1990 [JP] Japan .................. 2-403585
Feb. 25, 1991 [JP] Japan .................. 3-029812

[51] Int. Cl.$^5$ ............................ C23C 16/00
[52] U.S. Cl. .................. 204/298.05; 118/723 CB
[58] Field of Search .......... 204/298.04, 298.05, 204/192.31; 118/723, 724, 726; 427/523, 723 CB

[56] References Cited

U.S. PATENT DOCUMENTS

| | | | |
|---|---|---|---|
| 3,556,048 | 1/1971 | Paine | 204/298.05 X |
| 4,098,919 | 7/1978 | Morimoto et al. | 427/42 |
| 4,152,478 | 5/1979 | Takagi et al. | . |
| 4,213,844 | 7/1980 | Morimoto et al. | . |
| 4,394,210 | 7/1983 | Morimoto et al. | 156/608 |
| 4,480,010 | 10/1984 | Sasanuma et al. | . |
| 4,501,225 | 2/1985 | Nagao et al. | . |
| 4,526,802 | 7/1985 | Sato et al. | . |
| 4,624,859 | 11/1986 | Akira et al. | . |
| 4,990,575 | 1/1990 | Ito et al. | 118/723 |
| 5,041,302 | 8/1991 | Koide | . |

FOREIGN PATENT DOCUMENTS

| | | |
|---|---|---|
| 0035894 | 9/1981 | European Pat. Off. . |
| 0095384 | 11/1983 | European Pat. Off. . |
| 0141417 | 5/1985 | European Pat. Off. . |
| 0166349 | 1/1986 | European Pat. Off. . |
| 0463230 | 1/1992 | European Pat. Off. . |
| 54-9592 | 1/1979 | Japan . |
| 1209266 | 10/1970 | United Kingdom . |
| 1258540 | 12/1971 | United Kingdom . |
| 1356861 | 6/1974 | United Kingdom . |
| 1422307 | 1/1976 | United Kingdom . |
| 1483966 | 8/1977 | United Kingdom . |
| 2156578 | 10/1985 | United Kingdom . |
| 2217514 | 10/1989 | United Kingdom . |
| 2223032 | 3/1990 | United Kingdom . |

OTHER PUBLICATIONS

Ito et al., "Development of Ionized Cluster Beam Source for Practical Use", Rev. Sci. Instrum 61 (1), Jan. 1990, pp. 604–606.

Primary Examiner—Nam Nguyen
Attorney, Agent, or Firm—Oblon, Spivak, McClelland, Maier & Neustadt

[57] ABSTRACT

A thin film forming apparatus which utilizes cluster ion beam deposition to form thin films on a substrate. In one embodiment, the electrons which ionize the vapor clusters are generated by a cathode which is located inside the corresponding anode. The cathode serves not only as a source of electrodes but also as a means for heating the crucible containing the substance to be deposited. In another embodiment, an electron emitter located at a position remote from the vapor flow in the apparatus is utilized as the source of electrons to form the ionized clusters.

17 Claims, 5 Drawing Sheets

THIN FILM-FORMING APPARATUS

This application is a continuation of application Ser. No. 07/806,326, filed on Dec. 13, 1991, now abandoned.

FIELD OF THE INVENTION

The present invention relates to an apparatus and method for forming thin films by the cluster ion beam deposition method also known as the ICB method.

BACKGROUND OF THE INVENTION

High quality thin films for semiconductor, optical, magnetic and insulating utilities hays traditionally been formed by ICB methods. A typical prior art apparatus for use in such methods is disclosed in Japanese Patent Publication Number 54-9592 which is illustrated in FIG. 2. The prior art apparatus suffers from several significant deficiencies. First, when it is desired to produce a silicon or aluminum thin film, the vapors of these materials will react with tantalum and molybdenum which are typically used to form the ionization filament and electron extraction grid in the conventional apparatus. This reaction causes corrosion or erosion of both the grid and the filament which reduces their expected life and requires frequent replacement of same. Yet another problem which is encountered with the conventional apparatus in sputtering silicon or aluminum to form thin films is the good wettability of these materials with respect to the material normally used to form the melting crucible in the apparatus. As a result of the excellent wetting properties of the aluminum and silicon when in the molten state, they may creep up the inner walls of the crucible and exit in liquid form from the vapor ejection nozzle. This material is then free to creep along the top and down the sides of the crucible where it is ultimately vaporized in the space between the crucible and the heating element. As a result of this vaporization the impedance of the space between the crucible and heating element is lowered which results in this space becoming electrically conductive thereby preventing stable operation of the thin film forming apparatus. Yet other problems arise in the trapping of electrons emitted by the ionization filament in the electron drawing or attracting electrode. As a result, the ionization efficiency of the conventional apparatus is lower than would be desired.

The conventional prior art apparatus and its method of operation will now be illustrated with reference to drawing FIG. 2. In FIG. 2, Item 1 designates the vacuum vessel maintained at the predetermined, desired degree of vacuum; 2, represents the connection to the vacuum system for evacuating the inside of the vacuum vessel to the desired vacuum conditions; and 3, a vapor generating source accommodated in the vacuum vessel 1 at a lower position thereof. The vapor generating source 3 comprises a closed cylindrical crucible 4 having a nozzle portion 5 at an upper portion thereof, a heating filament 6 would in a solenoid shape and in the circumferential direction of the crucible 4 in order to heat the crucible 4, and a shielding plate 7 for shielding heat from the heating element 6. Material to be deposited is shown as Item 8 in crucible 4.

Item 9 designates the ionization means, which comprises an ionization filament which emits electrons and a grid 11 for accelerating the electrons emitted from the ionization filament 10, and a heat shielding plate 12 for shielding heat from the ionization filament 10. Item 13 designates the acceleration means which comprises an acceleration electrode 14 and an earth electrode 15 which causes the ionized clusters 33 to be accelerated by an electric field formed by the acceleration electrode 14 and the earth electrode 15. Item 16 designates the substrate which is disposed at the upper portion of the vacuum vessel 1 opposite from the nozzle 5 of the crucible 4. The substrate serves as the object on which the thin film 34 is formed.

A power source is designated as Item 20 which comprises a heating power source 21 for sending current to, and thus heating, heating filament 6; 22, a biasing power source for maintaining the crucible 4 at a positive potential with respect to the heating filament 6; 23 is an AC power source for heating the ionization filament 10. A DC power source, 24, is used to maintain the grid 11 at a positive potential with respect to ionization filament 10. An acceleration power source, 25, is connected between the earth electrode 15 and the acceleration electrode 14 in order to generate an electric field in the space between the earth electrode 15 and the acceleration electrode 14, and also to maintain the ionization means 9, as well .as vapor generating source 3, at a positive potential with respect to the earth electrode 15.

The operation of the prior art apparatus will now be described. First, the desired vacuum is obtained and maintained through exhaust, 2, to achieve the desired vacuum. Usually, the vacuum is on the order of $10^{-6}$ Torr. Subsequently, the heating power source 21 provides power to heating filament 6. Electrons thus emitted from heating element 6 are accelerated by the electric field which is generated by biasing the power source 22, in the space between the heating filament and the crucible 4, and are collided with the crucible 4 thereby heating the crucible 4 and the substance for deposition 8 which is present in the crucible. Ultimately, the heating causes a portion of the substance 8 to evaporate and to be ejected upwards from the nozzle 5 forming a vapor flow 31.

When the vapor from the substance 8 passes through the space defined by the nozzle 5, undergoes accelerated cooling due to adiabatic expansion which causes the vapor to condense to generate groups of clustered atoms, called clusters. A portion of the clusters 32 are ionized by electrons emitted from the ionization filament 10 which has been heated by AC power source 23 and accelerated by grid 11, whereby a portion of the clusters are transformed into ionized clusters 33. The ionized clusters are accelerated by the electrical field formed by the acceleration means 13, and moved together with non-ionized neutral clusters 32 towards the substrate 16. The clusters collide with the surface of the substrate to form a thin film 34 thereon.

As can be seen from the foregoing description, the ionization filament 10 and the grid 11 are in the vapor flow and its possible during the process that a portion of this vapor wall deposit on the filament and grid which can cause difficulties, especially if the material is capable of reacting with the filament or grid. Often, the grid and filaments are made from tantalum or molybdenum which will react violently with materials such as silicon on aluminum which are often formed into thin films using this technique.

As is also apparent from the foregoing description, the electron drawing electrode is disposed between the ionization filament and the target clusters. Many of the electrons which are generated are captured by the electron-drawing electrode and thus do not provide for any ionization activity which reduces the overall efficiency of the ionization filament. Yet another problem with the conventional apparatus is the tendency of either the silicon or aluminum to wet the crucible and ultimately to become vaporized in the space between the heating electrodes 5 and the crucible 3 creating unstable operation which precludes the formation of a good quality film.

Accordingly, a need exists for a sputtering apparatus capable of a long life under stable conditions which operates at a high ionization efficiency.

SUMMARY OF THE INVENTION

It is one object of the present invention to provide a sputtering apparatus which has an extended operational life.

It is a further object of the present invention to provide a sputtering apparatus with an improved ionization energy efficiency.

It is yet another object of the present invention to provide a sputtering apparatus which can stably sputter molten metals which wet the sides of the heating crucible in the sputtering apparatus.

It is a further object of the present invention to provide a sputtering apparatus which produces sputtered films having electrical properties similar to that of the bulk films.

These and other objects of the present invention which will become obvious from the disclosure which follows have been achieved by a sputtering apparatus in which the conventional electron-drawing electrode is not employed. In one embodiment the apparatus utilizes an electron emitter to generate the necessary ionized metal clusters and in another embodiment utilizes a cathode as the ionization filament located inside a space defined by an anode which acts as the electron attracting electrode.

DESCRIPTION OF THE PREFERRED EMBODIMENTS

Figure 1:
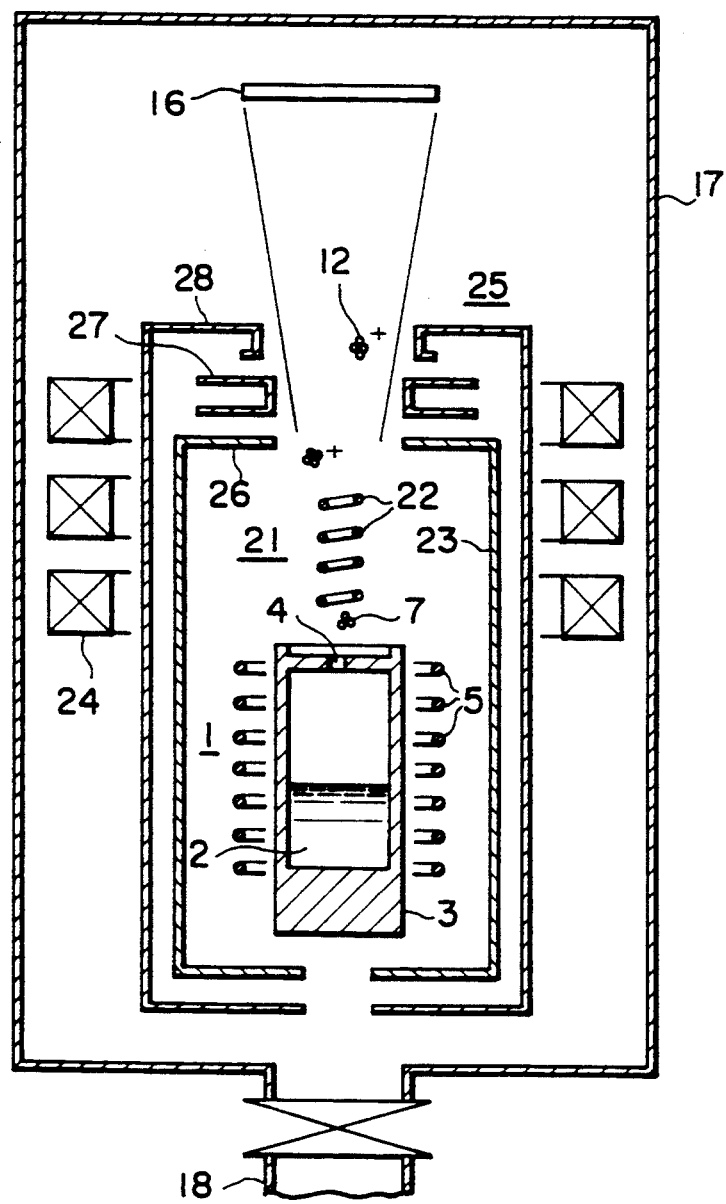
FIG. 1 illustrates an embodiment of this invention which uses an ionizing filament which comprises an anode disposed at a position opposite the outlet nozzle from the crucible and an anode which surrounds the cathode ionizing device.

In one embodiment of the present invention the apparatus comprises a conventional crucible having a nozzle opposite which is disposed a cathode which when heated emits electrons with the anode surrounding the cathode. In a particularly preferred embodiment, the anode surrounds both the cathode which functions as the electron emitter and the crucible and its associated heating coils. In this manner, the electrons which are generated at the cathode can come into direct contact with the vapor clusters which are emitted from the nozzle on the crucible without having to first pass through an electron attracting grid. This avoids the inefficiencies which are created when the electrons rather than being available to form ion clusters are trapped by the grid. The cathode also serves as a heating element which can vaporize any liquid which may creep up the crucible walls by heating the nuzzle area and top portion of the crucible. Thus, in a particularly preferred embodiment of the preferred invention the cathode is disposed in a position such that the heat it emits serves to heat the nozzle portion of the crucible.

As a result of the heating of the nozzle portion of the crucible any liquid aluminum or silicon or other material which my creep from the crucible is vaporized at the top surface of the crucible and is available to form the desired thin film. In prior art apparatus the material would creep across the top of the crucible and down the sides to become vaporized in the space between the heating coil 32 in FIG. 2 and the crucible 4 in FIG. 2. This liquid material is then vaporized in this space and prevents stable operation of the crucible by creating an electron conducting vapor.

In a particularly preferred embodiment the electrons which are emitted at the cathode are induced to move in a non-linear manner so as to increase the probability of contact with a vapor cluster thereby improving overall operating efficiency. It is particularly preferred to move the electrons in a helical path to maximize the amount of electron travel to thereby maximize the probability that any individual electron will form art electron cluster. Inducing non-linear movement requires that two fields act on the electrons. Considering the cathode and anode portions of the electron emitting cathode, these portions induce a linear motion in the electrons, such as the left to right relationship illustrated in drawing FIG. 1. By introducing a second field acting on the electrons which is not parallel to the electrical field this second force will cause the electrons to move non-linearly. While the second field can essentially have any angle relative to the direction of the field generated by the cathode and anode, it is particularly preferred that this field be perpendicular to the electrical field so as to achieve the maximum travel on the part of the electrons which would be helical. One technique for generating such a field is to apply a magnetic field perpendicular to the electrical field. This is illustrated in drawing FIG. 1 by magnets 24 whose magnetic field is perpendicular to the electrical field generated by cathodes 22 and the anode 23. As a result of this arrangement the magnetic field tends to attract the electrons vertically while the electrical field tends to attract the electrons horizontally by adjusting the magnetic force it is possible to induce the electrons to move helically.

The arrangement of the electron emitting cathode inside of the anode has the advantage of reducing the probability that any metal vapors will condense on the electron emitting structure. The cathode is a heating element and thus tends to impart additional heat to the metal vapor thereby preventing its deposition in liquid form on the electrode structure which in turn reduces the rate at which the metal vapor and electrode structure will interact. This has the affect of substantially increasing the life of the electron generating elements in the sputtering apparatus. Furthermore, it also has the advantage of increasing the relative vapor pressure of the metal which is to be sputtered. That is, the additional heat generated by the cathode tends to counteract the adiabatic cooling which the metal vapor undergoes as it ejects to the nozzle on the crucible, shown as Item 4 in FIG. 1. This adiabatic cooling has an affect in conventional apparatus of reducing the overall vapor pressure of the metal to be deposited. The increase in vapor pressure helps to improve ionization efficiency.

Metals which can be sputtered by the present technique include aluminum, titanium, gold, copper, silicon dioxide, aluminum trioxide, titanium dioxide, barium-yttrium-copper oxides and other materials which form superconductive films. The materials which can be sputtered by the present technique include all of those which can be sputtered by the prior art apparatus. The materials for construction of the present apparatus are those conventionally employed in the art. That is, the crucible, electrodes, heating elements and the like are all standard materials utilized in conventional sputtering apparatus. The difference is in the order or arrangement.

In yet another preferred embodiment control of the quantity of ionized clusters and, hence of total clusters which are incident upon the substrate can be controlled by arrangement of an additional sequence of electrodes above the ionization region. This arrangement includes an acceleration electrode, an attraction electrode and an earth electrode which serves as control electrode and as a ground potential. In this arrangement it is possible by controlling the potential difference between the acceleration electrode and the attraction electrode to control the level of clusters which are directed towards the substrate while the control electrode allows for deceleration of the ionized clusters so as to control the velocity at which they impact the substrate which allows easy control of the properties of the thin films. Furthermore, through this arrangement it is possible to preclude electrons from escaping from the ionization zone and thereby impacting on the substrate which can cause undesirable effects on the thin film. It is preferred that the attraction electrode be located closest to the ionization zone, that is furthest away from the substrate with the attraction electrode being intermediate between the substrate and the ionization zone and the control electrode being located the furthest from the ionization zone and the closest to the substrate. This arrangement allows for easy control of the present apparatus, If the voltage potential between the acceleration electrode and the control is greater than 1,000 volts, then the attraction electrode may be omitted. However, in this embodiment the flexibility of the apparatus is reduced. When the acceleration voltage, that is, the potential between the acceleration electrode and the control electrode is below 1,000 volts and especially if it is below 500 volts, then the use of the attraction electrode is very effective in assisting in the efficient and effective operation of the apparatus. It is preferred that the biased voltage between the acceleration electrode and the control electrode be less than 2,000 volts. This limitation on the voltage bias is to avoid damage to the thin film formation by excessive acceleration of the clusters.

In a particularly preferred embodiment the electron-attracting anode which cooperates with the electron-emitting filament to cause the emission of electrons is formed into a shield which completely surrounds both the ionization zone and the melting zone including the crucible and its heaters. In this manner it functions not only as the anode for electron generation but also as a heat shield to help retain the heat energy in the vapor thereby assisting in maintaining a higher metal vapor pressure than might otherwise be achieved. The shielding in effect traps the heat generated by the heating coil surrounding the crucible and by the ionization filament and makes this heat available to the metal vapor to increase its vapor pressure. This increased vapor pressure improves the ionization efficiency. In a more particularly preferred embodiment the control electrode is also formed into a shield and completely surrounds the acceleration portion of the device as well as the lower portions of the device where the heating filament and crucible are located. It is particularly preferred that the shield provided by the control electrode completely surround the shield provided by the electron-attracting anode which functions in cooperation with the ionization filament to generate the necessary electrons. That is, much of the apparatus contains two heat shields which further improve the retention of the heat in the zone where the vapor is initially generated and adiabatically expanded. The two shields cooperate to restrain the heat within the area where it will do the most good, the crucible and ionization zones. In this manner, the vapor pressure of the metal vapor is not as adversely affected by the adiabatic cooling as it exits the nozzle as it might otherwise be since the vapor space above the crucible is at a higher temperature than in conventional, less shielded apparatus.

Figure 3:
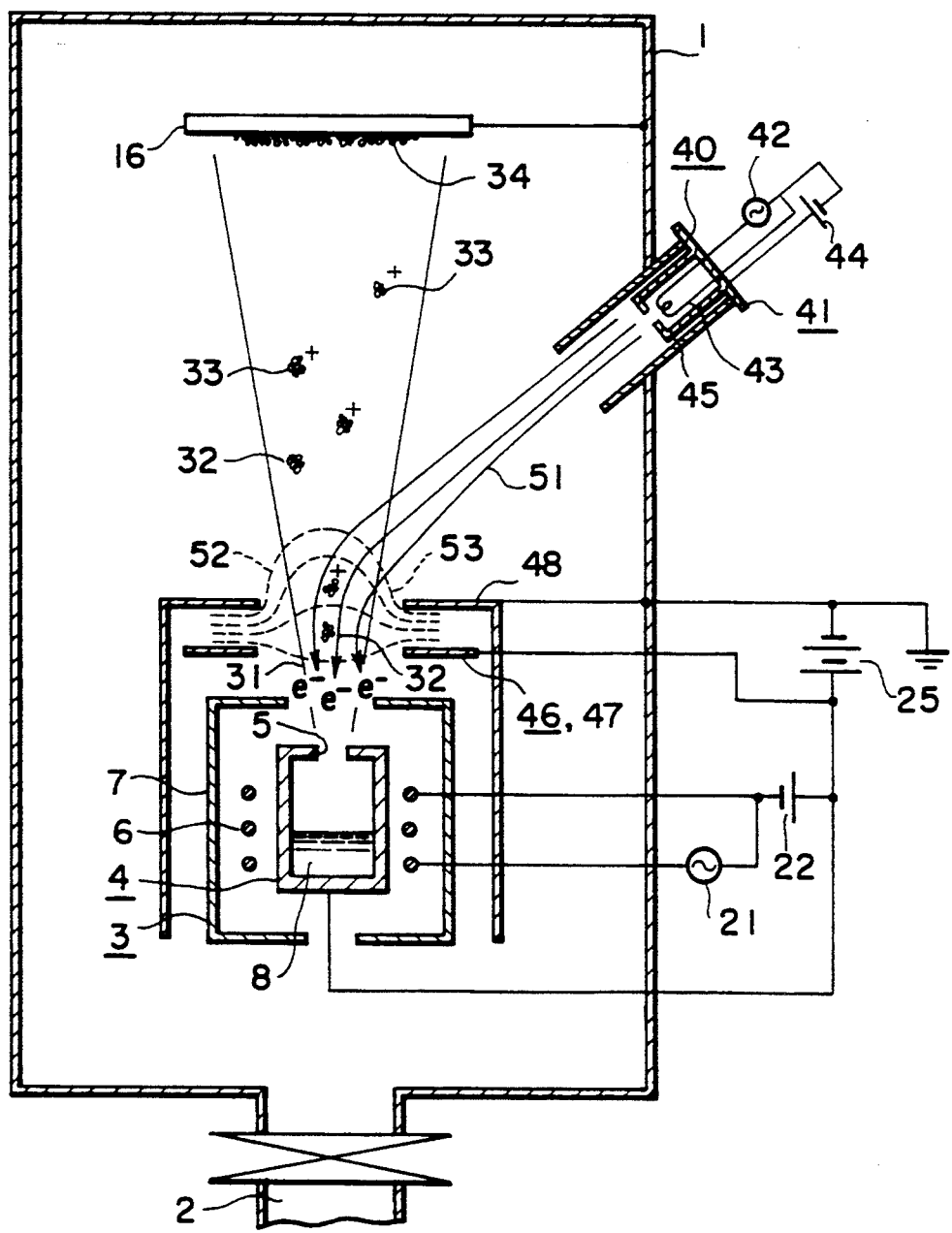
FIG. 3 illustrates another embodiment of the present invention wherein the source of electrons to form the ionized clusters is an electron gun.

This embodiment has a distinct advantage over the prior art in that its electron emitting cathode has an expected life of an excess of 100 hours as compared with the 3 hours typical of prior art devices especially when used with highly reactive metals. On the other hand, the electron emitter in this embodiment remains in the flow of the vapor and will ultimately be eroded and require replacement. In the second embodiment the electron emitting apparatus is located distant from the vapor flow such that the vapor flow never contacts with the electron emitting apparatus. This allows for the deposition of even violently reactive materials with little or no risk that the working life of the electron emitter will be adversely impaired. One problem with prior art apparatus for depositing high reactive material is that the reaction product between the metal vapors to be deposited and the electron emitter are often also deposited in the film which reduces the quality of the resulting film since it is no longer pure but contains undesirable impurities. By locating the electron emitter source at a location where it is not contacted with the vapor this problem can be obviated. In this device the metal vapor is generated as described previously by the use of a heated crucible having a suitable nozzle. The vapor as it exits the crucible is introduced into an electrical field which functions much like a lens to control the ionization by attracting the electron into the field where they cause ionization of the vapor cluster. These electrodes then accelerate the ionized clusters towards the substrate. It is preferred that the electrode closest to the crucible, that is furthest from the substrate have a potential which is positive with respect to the second electrode which is located furthest from the crucible and closer to the substrate than is the control electrode. In this manner, an electrical field is formed having equally potential surfaces which form much like a lens. These are illustrated in FIG. 3 at 52 and 53 with a lens-shape of the equally potential lines as illustrated. As a result of this electrical field the electrons which are emitted from the remote source are focused onto the vapor clusters and the resulting vapor clusters are accelerated towards the substrate.

Essentially any device which can generate electrons can be used as the electron emitter with the preferred source being an electron gun illustrated at Item 41 in FIG. 3. Regardless of the type of electron emitter which is used, it is important that the electrodes not have excessive energy such that they create multi-charged ions when they impact on the vapor clusters. That is, if the electrons have excessively high energies when they impact with the vapor clusters they may create some clusters which have multiple charges, i.e., +2 or +3 charges. It is desirable to operate the emitter at energy levels such that the electrons only generate single charged ionized clusters. When the electron emitter is an electron gun, voltage on the order of from about 10 to 500 volts at the electron extracter has proven to be successful. Within this range the electrons have sufficient energy to generate ionized clusters but insufficient energy to generate ionized clusters having multiple charges. When the voltage is too low, only a few ionized clusters are formed while when the voltage is excessive, ionized clusters having multiple charges are generated.

In an additional embodiment, a third electrode may be arranged such that it is disposed between the earth electrode and the substrate to control the velocity of the ionized clusters as described with respect to the first embodiment. This would allow for greater control over both the incoming electrons and the exiting ions.

It is preferred that the control electrode and earth electrode be disc shaped, but other shapes can also be used and the electrodes can even have a mesh type shape if that is desired. Regardless of the shape of the various control and earth electrodes, their arrangement is such that they simultaneously attract and control the electrons from the emitter such they impact and ionize vapor clusters and simultaneously accelerate the ionized clusters towards the substrate. So long as the shape and arrangement of the control and earth electrodes achieve this objective shape is not important.

The materials of construction of the electrodes is similarly unimportant especially where a disc shaped electrode is utilized and the amount of contact between the vapor and the electrode is minimized. When a mesh type electrode is employed contact between the vapor and the electrode is maximized thereby increasing the possibility of reaction between the vapor and the electrode. In this instance, it is desirable that the electrode be as non-reactive as possible.

The operation of the various embodiments of this invention will be illustrated by reference to drawing FIGS. 1 and 3 and will be compared to the operation of a conventional sputtering device as illustrated in drawing FIGS. 2 and 4. These drawing figures are not limitative of the apparatus of the present invention but merely illustrative.

In order to provide a point of reference prior art sputtering device and its operation will be described first. Referring to FIG. 4, Item 1 designates the combination of crucible and heating element which cause the substance shown as 2 to vaporize for subsequent deposition. The crucible is shown as 3 having a nozzle, 4, formed in its upper section and surrounded by heating filament 5 which serves to heat the crucible. Item 6 is a first heat shielding plate which shields the heat generated from heating element 5. The crucible, heating element and first heat shielding plate together constitute the vapor generating source, 1.

Clusters, that is groups of clustered atoms, which have been generated as a result of the vaporization of 2 are designated as Item 7 and are ejected upward from the crucible through nozzle 4. These clusters are ionized in the ionization device, 8, which is provided above the vapor generating source to ionize the cluster 7. An ionization filament 9 emits electrons which are attracted by a grid-shaped electron drawing electrode, 10, which draws or attracts electrons from the ionization filament and accelerates the electrons towards the cluster 7. A second heat shielding plate, 11, shields the heat generated by the ionization filament 9. The ionization filament, the electron-drawing electrode and the heat shielding plate together constitute the ionization device 8. The ionized clusters, 12, which have been formed in the ionization device 8, are accelerated toward the substrate 16 by the acceleration device shown as 13. The acceleration device comprises an acceleration electrode 14 and an earth electrode 15. The earth electrode 15 has the ground potential and the acceleration electrode 14 has a positive potential with respect to the earth electrode.

The substrate on which the film is formed, 16, has a ground potential. All of the above components are maintained inside a vacuum vessel, 17 which is connected to a vacuum source by a conduit 18.

The prior art apparatus is operated by first establishing a vacuum in vessel 17, typically, the vacuum is on the order of $10^{-6}$ Torr. The voltage supplied to the crucible 3 such that it has a positive potential relative to the heating element 5. As a result, electrons are emitted by heating element 5 and drawn by an electrical field to its crucible 3 and caused to collide with the crucible. In this manner heating is effected to the desired temperature at which the vapor pressure of several Torr prevails within the crucible 3. The heating of the crucible causes substance 2 in the crucible to evaporate with the resulting vapor exiting upward from the crucible through nozzle 4. When the vapor passes through the nozzle 4, the vapor undergoes accelerated cooling due to adiabatic expansion which causes the vapor to condense as cluster 7.

In the ionization device 8, the electron-drawing electrode 10 has a positive potential with respect to ionization filament 9. When the ionization filament 9 is subjected to electrical conduction and heating, the electrons emitted from the ionization element are drawn by the electron-drawing electrode 10. A portion of the electrons are captured by the electron-drawing electrode 10 while the remainder escape through gaps in the grid in the electrode 10 to collide with clusters 7. The energy of the collision causes the electrons of the clusters to be expelled forming ionized clusters 12 having a positive charge.

In the acceleration device 13, the ionized clusters are accelerated by an electric field formed between the acceleration electrode 14 and the earth electrode 15 in the upward direction, that is towards the substrate 16. The ionized clusters as well as the non-ionized or neutral clusters 7 collide with the substrate 16 forming on the surface of the substrate a thin film (not illustrated in this figure) formed from the substance 2.

As discussed previously in this conventional apparatus when the material to be deposited is silicon or aluminum this material may creep in liquid form out through the nozzle of the crucible across the top and down the sides. When either the aluminum or silicon is vaporized it lowers the impedance of the space between the crucible and the heating element making it possible to apply a voltage to this space thereby precluding stable operation of the device. Furthermore, the material which creeps in liquid form through the nozzle may become entrained and thereby wet other portions of the apparatus causing corrosion and otherwise impairing the operation.

Yet another problem with this arrangement is that when one controls the potential difference between the acceleration and the earth electrode to control the accelerations of the clusters to thereby control the properties of the thin film, variation in this potential, acceleration voltage, causes a variation in the amount of ionized clusters which are attracted. In particular, as the acceleration voltage is decreased, the amount of ionized clusters that reaches the substrate is also reduced. Thus, it is difficult to form thin films at high quality by utilized the electrical characteristics of the ionized clusters.

Furthermore, if the acceleration voltage is reduced to a value close to zero, the electrical field between the acceleration electrode and the earth electrode weakens to such an extent that some of the electrons emitted from the ionization filament may become incident on the substrate which may damage the substrate and thin film formed thereon.

The detailed description of the first embodiment including the apparatus and its method of operation will now be described with reference to drawing FIG. 1. In drawing FIG. 1 Items 2–5, 7, 12, and 16–18 are the same as those described for drawing FIG. 2. In drawing FIG. 1 the vapor generating source is designated as Item 1 and comprises the vapor from which the film is to be formed, 2, which is generated by the crucible 3 in the heating element 5.

The ionization device, 21, is disposed above the vapor generating source in order to ionize the clusters 7. The ionization filament, 22, serves as the cathode and is disposed at a position opposite nozzle 4. The ionization filament then emits electrons when subjected to electrical conduction and heating. The anode, 23, surrounds both the ionization film 22, the crucible 3 and the heating filament 2. The ionization element 22 and the anode 23 together constitute the ionization device 21. In this specific embodiment a magnetic field is applied by magnetic coils 24 which are disposed outside of the ionization device 21. The magnetic field is applied preferentially perpendicular to the electrical field.

An acceleration device, 25, is disposed above the ionization device 21 in order to accelerate the ionized clusters 12 towards the substrate 16. An acceleration electrode, 26, is integrally connected with anode 23, with electrode 27 functioning as the attraction electrode and electrode 28, an earth electrode, which functions as the control electrode and has the ground potential. The acceleration electrode 26, the attraction electrode 27 and the earth electrode 28 are arranged in this order such that these electrodes become increasingly distant from the nozzle 4. That is, that acceleration electrode 26 is closest to nozzle 4 and earth electrode 28 is furthest from nozzle 4. In relation to earth electrode 28, the acceleration electrode 26 has a positive potential and the attraction electrode 27 has a negative potential. In other words, the attraction electrode has a negative potential with respect to the acceleration electrode and the earth electrode has a potential intermediate between those of the acceleration electrode and the attraction electrode. These three electrodes, 26, 27 and 28, constitute the acceleration device 25.

The operation of this embodiment will now be described. In operation, the crucible 3 is heated by heating filament 5 and the vapor of substance 2 is ejected from nozzle 4 to form clusters 7. The ionization filament 22 is subjected to electrical conduction and heating so that electrons are emitted from the ionization filament towards anode 23 and collide with the clusters 7 to ionize them. During this process the electrons do not pass through gaps in a grid such as that utilized in the prior art device and thus none of the electrons are captured before they have an opportunity to collide with clusters thereby increasing the efficiency of the ionization device. Furthermore, in this particularly preferred embodiment the magnetic field applied by device 24 is perpendicular to the electrical field generated by the ionization filament 22 and the anode 23. That is, the electrical field is generally horizontal in the drawing figure and the magnetic field is generally vertical. As a result of this perpendicular relationship the electrons moved in a helical direction increasing the length of the path from the cathode to the anode thereby increasing the probability of colliding with a cluster to improve ionization efficiency.

The ionization filament 22 also heats the crucible in the region of the nozzle 4, that is, the upper portion of crucible 3. Thus, even when a portion of substance 2 in its molten state creeps on the inner wall of the crucible 3, this portion which creeps up the inner wall is caused to evaporate at the upper portion of the crucible 3 precluding bleeding of the material which causes the difficulties discussed previously. Furthermore, since anode 23 surrounds heating element 5 in crucible 3, the anode is maintained at a high temperature. Thus, condensation of the vapor generated from substance 2 is prevented which precludes wetting of the anode and reduces corrosion. Finally, this arrangement eliminates the possibility of vapor filling the space between the crucible 3 and the heating element 5 to lower the impedance of the space. As a result, stable operation of the device can be maintained even when depositing silicon or aluminum metal.

The ionized clusters 12 formed in the ionization device 21 have a positive charge and are drawn from the ionization device towards the substrate 16 by the electrical field formed by the acceleration electrode 26 and the attraction electrode 27. When the ionized cluster is passed through the space between the attraction electrode 27 and the earth electrode 28, since the earth electrode 28 has a positive potential in relation to the attraction electrode 27, the ionized clusters 12 are decelerated in this space. As a result, kinetic energy is imparted to the ionized clusters which corresponds to the potential difference between (the acceleration voltage across) the acceleration electrode 26 and the earth electrode 28.

This arrangement allows control of the acceleration of the ionized clusters 12 by the acceleration voltage while maintaining the amount of ionized clusters which are drawn from the ionization device 21 at any desired level through control of the potential difference between the acceleration electrode 26 and the attraction electrode 27. Even with a small acceleration voltage, it is possible to ensure a sufficient quantity of ionized clusters while simultaneously utilizing their electrical characteristics to form the desired thin film.

In addition, this arrangement also prevents electrons emitted from the ionization filament 22 from becoming incident on the substrate 16 by the electrical field formed by the attraction electrode which has a negative potential.

Obviously, many variations on the device illustrated in FIG. 1 are possible. For example, it is possible to eliminate heating element 5 and to heat-crucible 2 solely by the heat generated by ionization filament 22. In addition, the magnetic field and the magnetic coils 24 are also optional.

The advantages to the first embodiment include the direct projection of electrons from the cathode onto the vapor clusters which improves ionization efficiency. Furthermore, by heating the nozzle region of the crucible with the cathode the problems of liquid material bleeding out onto the exterior surfaces and the sputtering device are eliminated. In addition, the use of the acceleration electrode, the attraction electrode having a negative potential with respect to the acceleration electrode and the control electrode having a potential intermediate between that of the acceleration and attraction electrode allow one to control the acceleration of the ionized clusters while allowing control of the volume of clusters at the desired level. This arrangement also reduces the probability of electrons becoming incident to and thus damaging the substrate surface.

The second embodiment will now be described with respect to drawing FIGS. 2 and 3.

Figure 2:
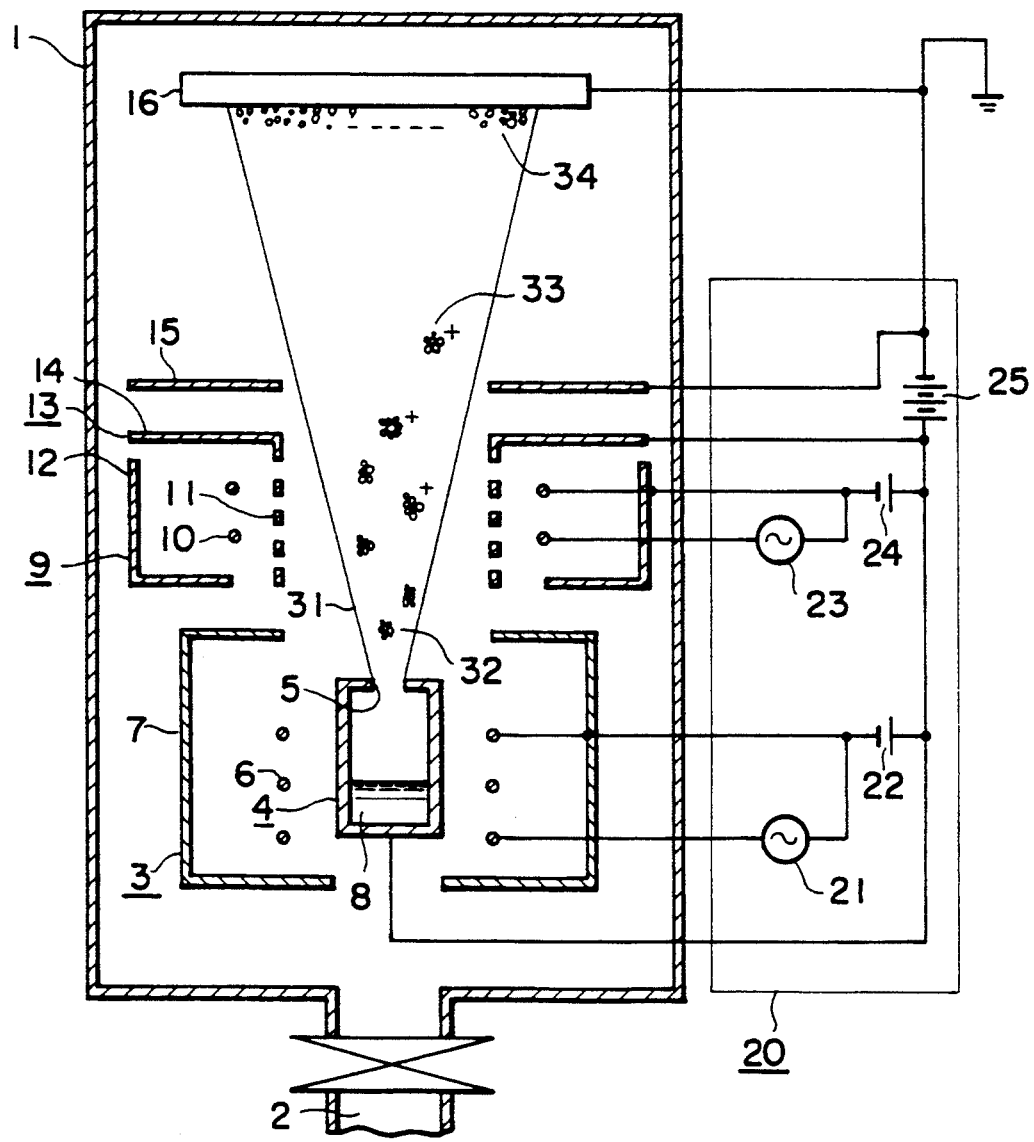
FIG. 2 illustrates the prior art of sputtering devices.
Figure 4:
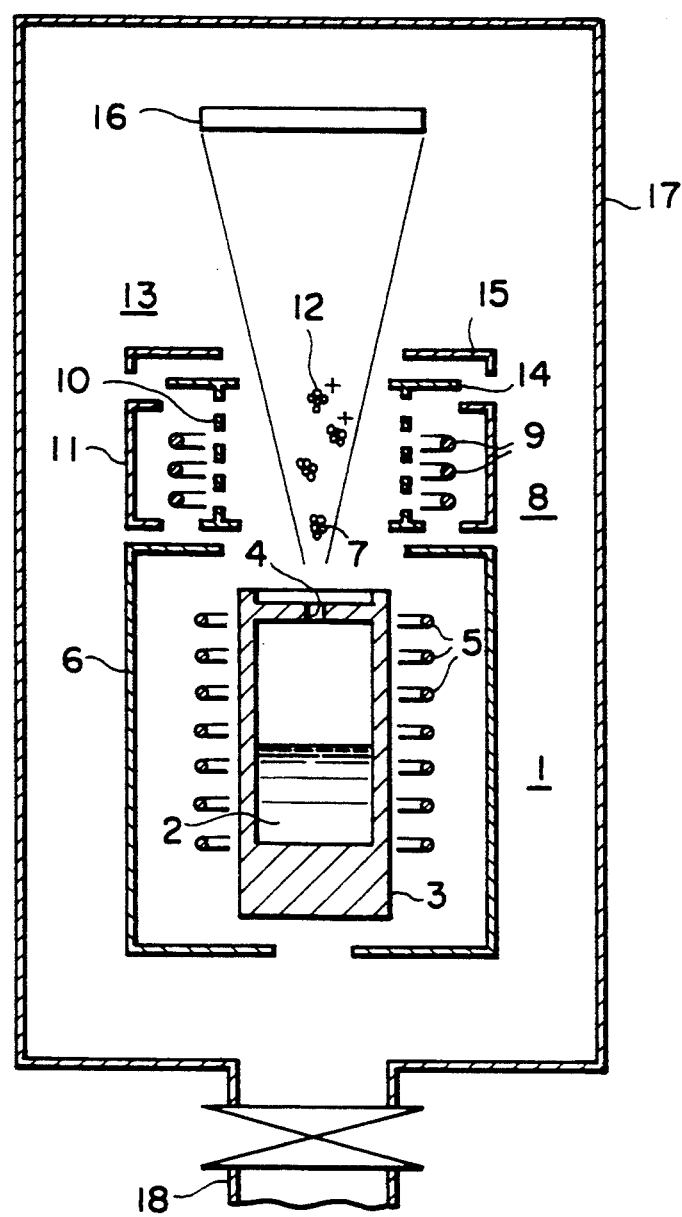
FIG. 4 is another rendition of the prior art.

The prior art apparatus illustrated in FIG. 2 is the same as that illustrated in FIG. 4 with the addition of a stylized wiring diagram to facilitate an understanding.

In FIG. 2, the vacuum vessel, 1, is maintained at a predetermined, degree of vacuum as discussed above, via a connection, 2, to the vacuum system. A vapor generating source, 3, is located in the lower portion of the vacuum vessel 1. The vapor generating source comprises a closed cylindrical crucible 4 having a nozzle portion 5 at the upper position thereof and a heating filament 6 wound in a solenoid shape and in a circumferential direction of the crucible 4 in order to heat the crucible, and a heat shielding plate 7 for shielding the heat from the filament 6. The material for deposition is 8 in crucible 4.

An ionization means, 9, comprises an ionization filament 10 for emitting electrons, a grid 11 for accelerating electrons emitted from the ionization filament 10 and a heat shielding plate 12 to shield the heat generated by the ionization filament 10. Acceleration means, 13, comprises an acceleration electrode 14 and an earth electrode 15 which causes ionized clusters 33 to be accelerated by an electrical field formed by the acceleration electrode 14 and the earth electrode 15. The substrate which forms the target, 16, is disposed at the upper end of the vacuum vessel in an opposing relationship with the nozzle 5 of the crucible 4. The substrate serves as the object on which the thin film, 34, is formed.

A power source, 20, is provided which comprises a heating power source, 21, for sending current 2, and thus heating, heating filament 6; a bias powering source, 22, which maintains the crucible at a positive potential relative to the heating filament 6; an AC power source, 23, which heats ionization filament 10; and an acceleration power source, 25, connected between the earth electrode 15 and the acceleration electrode 14 in order to generate an electric field in the space between the earth electrode 15 and the acceleration electrode 14, and also to maintain the ionization means 9 and the vapor generating source 3 at a positive potential with respect to the earth electrode 15. The operation of this device will now be described. A vacuum is generated inside vessel 1 by connection to the vacuum system through 2 until the vacuum vessel 1 is on the order of $10^{-6}$ Torr. Subsequently, heating power source 21 is activated to generate heat at the heating element 6. The electrons emitted from heating element filament 6 are accelerated by an electric field generated by the biasing power source 22 in the space between the heating filament and the crucible 4. The electrons collide with crucible 4 heating crucible 4 and the substance, 8, which it contains. This heating causes a portion of the substance 8 to vaporize and to be ejected upward from the nozzle 5 to form a vapor flow 31.

When the vapor from 8, passes through the space defined by the nozzle 5, the vapor undergoes accelerated cooling as discussed with respect to embodiment 1. A portion of the clusters, 32, are ionized by the electrodes emitted from the ionization filament 10 (heated by power source 23) then accelerated by the grid 11 whereby a portion of the clusters are transformed into ionized clusters 33. The ionized clusters are accelerated by the electrical field formed by the acceleration means 13 and move, together with the non-ionized, that is neutral, clusters 32 towards the substrate 16. The clusters collide with the surface of the substrate 16 to form the thin film 34.

As can be appreciated, in use both the ionization filament 10 and the grid 11 are provided close to, and indeed are in the flow of the vapor 31. In such instances, the vapor may cause erosion of the materials forming both the film and in the grid, which products can become vaporized or entrained with the vapor to be deposited on the thin .film thereby introducing impurities in the film which is formed. This is particularly true when attempting to deposit highly reactive substances such as silicon or aluminum which can react violently with materials such as tantalum or molybdenum which are typically utilized to form the ionization filament 10 and the grid 11 as well as other component parts of the apparatus.

Description of the second embodiment of the present invention which is designed to obviate the presence of the ionization filament and the attraction grid will now be discussed with reference to drawing FIG. 3. In drawing FIG. 3, the same numerals are utilized to identify those parts of the apparatus which are common with the prior art apparatuses described in drawing FIG. 2. Thus, description of both the apparatus and the process will concentrate primarily on the electron emitter portion of this apparatus.

Ionization means, 40, for ionizing clusters 32 in a vapor flow 31 comprises an electron gun 41 which serves as an electron emitting means for radiating an electron beam towards the vapor flow 31, and an ionization section 46 for generating an electrical field for accelerating ionized clusters 33. The electron gun itself is a conventional device and comprises a cathode 43 for emitting electrons when heated by a heating power source 42 and an acceleration electrode 45 which, in corporation with DC power source 44, generates an electrical field in the space between the acceleration electrode and the cathode 43 to accelerate electrons emitted from the cathode 43. The ionization section 46 comprises a control electrode 47 and an earth electrode 48, each being disc shaped and having a circular hole in the center allowing the passage therethrough of the flow of vapor 31. The control electrode 47 is maintained at a positive potential with respect to the earth electrode by an acceleration power source 25. The control electrode 47 and the earth electrode 48 form an electrical field, much like a lens, commonly referred to as an electron lens, 53 having equipotential surfaces 52 such as those indicated by broken lines in the drawing. The control electrode 47 serves to control ionization.

An electron beam 51 radiates from the electron gun 41 to its position above the earth electrode 48, i.e., towards the exit of the flow of vapor from the electrical field 53.

The electron beam 51 irradiated from the electron gun 41 towards the electrical field 53 is drawn into the electrical field and accelerated so that the beam collides with and thus ionizes clusters 32 in the flow of vapor 31 passing upward through the inside of the electrical field 53, the beam colliding in a direction opposing the vapor flow. Ionized clusters 33, which have been ionized, are accelerated by the potential of the electrical field 53 and kinetic energy is imparted to the clusters. The clusters then move towards an impact substrate 16 to form thin film 34.

In this manner, the electron beam 51 is drawn into the electrical field 53 to collide with the vapor flow 31 in the opposing direction to efficiently ionize vapor clusters.

Various modifications of the second embodiment illustrated in FIG. 3 can be envisioned. First, in addition to the control electrode 47 and earth electrode 48, additional electrodes may be provided to add control over both the electrons and the ions. Thus, a third electrode could be disposed still closer to the substrate source to regulate the velocity of the ionized clusters. That is, the electrodes potential could be selected to either accelerate or decelerate the ionized clusters as desired. While the control and earth electrodes have been described as disc shaped in this embodiment, alternative shapes may be used as well, including mesh type electrodes, bar electrodes or the like.

The concepts of embodiments 1 and 2 may be combined into a still more preferred embodiment. As can be seen, embodiment 2 removes completely from vapor contact the electron generating and emitting source but, provides no apparent, provision for the possibility that the molten material may creep up the walls of the crucible because of the excellent wetting action of materials such as aluminum and silicon. That is, when the material to be deposited is aluminum or silicon some of that material may bleed out of the crucible and ultimately be vaporized in the space between the filament 6 and the crucible 4 to prevent stable operation. The use of the heating element disposed above the nozzle would obviate this problem. To avoid this problem, one of two solutions are possible. In a first embodiment, an excess of electrons can be provided by the electron gun such that the excess electrons impinge upon the crucible thereby serving as a heat source for the crucible in the region adjacent to the nozzle. In this fashion, the electron gun not only serves to ionize the vapor clusters but also to vaporize the material in the crucible. In a second embodiment, the heating element could be disposed not in the path of the vapor as it exits from the nozzle but outside of the path so that the vapor would not come in contact with the filament since the electrons emitted by the filament would be necessary only to heat the area around the nozzle and not to generate the electrons which are used to generate the ionized clusters. This embodiment takes advantage of the first and second embodiments. Furthermore, the accelerating electrode structure of the first embodiment can be utilized in combination with the second embodiment to provide for maximum control over the ionized clusters as discussed above.

Figure 5A:
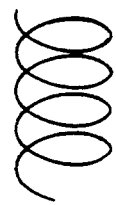
FIGS. 5a-5f illustrate alternative heating filament arrangements.
Figure 5B:
Figure 5C:
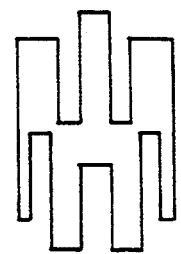
Figure 5D:
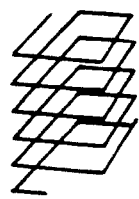
Figure 5E:
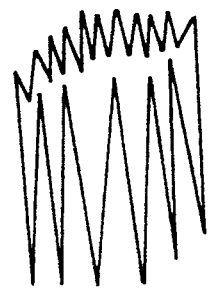
Figure 5F:
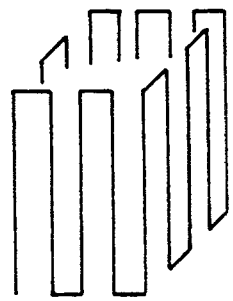

In both embodiments the heating filament of the crucible has been described as a solenoid type structure, i.e., spirally wound. However, alternative heating filament arrangements are possible as illustrated in FIG. 5. FIG. 5a is a conventional solenoid or spiral arrangement while b-f describe alternative arrangements. Particularly preferred are arrangements c and d because of their ease of manufacture and efficiency in heating.

The apparatus of this invention has been demonstrated to be able to produce films whose electrical resistivity approximates that of the bulk materials. For instance, when producing a thin aluminum film using prior art sputtering techniques, resistivities on the order of 10 micro-ohm-cm are typically achieved while when utilizing the present invention it is possible to produce films having resistivities of 2.7 micro-ohm-cm, approximately the same as that of the bulk material. For titanium, the prior art produces films having a resistivity of about 100 micro-ohm-cm as compared with 60 micro-ohm-cm when utilizing the present invention. In comparison bulk titanium has a resistivity of 57 micro-ohm-cm. The present invention produces films which have higher densities which leads to this resistivity as well as better adhesion properties to the substrate. Furthermore, single crystals are more easily formed which assists in achieving the higher densities utilized in the apparatus of this invention. In addition to producing thin electrically or semiconductive films, it is also possible to produce optical films which have very low absorption and high reflectivity which are also very hard. In particular, the laser damage threshold for lens films are greatly increased which is a particular benefit in excimer lasers. Utilizing conventional sputtering techniques the laser damage threshold for most optical films is on the order of 2 joules $cm^2$ as compared with 8 joules $cm^2$ when the films are produced utilizing the present invention.

Not only is a better film produced but also the deposition rate is greatly increased. Utilizing conventional apparatus deposition rates on the order of 0.1 microns per minute are achieved while with the present invention this is improved to up to 0.5 microns per minute. Furthermore, the source lifetime is increased to from about 3 hours to over 100 hours.

Utilizing the present technique, it is possible to produce metal circuits on many types of semiconductor devices including Drams microprocessors and the like including the formation of memory capacitors. Furthermore, the formation of highly reflective lenses for use on excimer lasers is possible. The formation of multiple layered reflective films is also possible using this technique. The present apparatus allows for the formation of films never before produced.

Having now generally described this invention, a further understanding can be obtained by reference to certain specific examples which are provided herein for purposes of illustration only and are not intended to be limiting unless otherwise specified.

What is claimed as new and desired to be secured by Letters Patent of the United States is:

1. A thin film apparatus, comprising:
   a crucible for holding a substance for deposition having an opening at a top portion;
   a heating means for heating the crucible and vaporizing the substance therein;
   an ionization means, disposed above the opening of the crucible, for generating electrons for ionizing clusters of the vaporized substance;

anode means, disposed circumferentially around the ionization means, the anode means having a positively charged voltage relative to the ionization means, the anode means for attracting the electrons generated by the ionization means, and causing the generated electrons to collide with the vaporized substance;

an acceleration means, disposed above the ionization means, for drawing ionized clusters of the vaporized substance towards a substrate for receiving the ionized clusters of the vaporized substance.

2. A thin film apparatus according to claim 1, wherein the acceleration means comprises:
a positively charged acceleration electrode.

3. A thin film forming apparatus according to claim 2, wherein the acceleration means further comprises:
an attraction electrode disposed above the acceleration electrode and having a negatively charged voltage, relative to the acceleration electrode; and
a control electrode disposed above the attraction electrode having a charge of a potential between the potential of the attraction electrode and the charge of the acceleration electrode.

4. A thin film forming apparatus according to claim 1, further comprising:
a magnetic field generating means, disposed circumferentially around the ionization means, for generating a magnetic field on the electrons generated by the ionization means, the direction of the magnetic field being substantially perpendicular to a direction of an electric field between the ionization means and the anode means.

5. A thin film forming apparatus according to claim 1, wherein:
the ionization means, in addition to generating electrons, generates heat for heating the substance in the crucible.

6. An apparatus according to claim 1, wherein the ionization means and anode means causes an electric field to be generated therebetween, wherein a direction of the electric field is substantially perpendicular to a line between a central portion of the ionization means and the opening in the crucible.

7. An apparatus according to claim 1, further comprising:
a magnetic field generating means, disposed circumferentially around the ionization means, for generating a magnetic field on the electrons generated by the ionization means, the direction of the magnetic field being substantially perpendicular to a direction of the electric field between the ionization means and the anode means;
wherein said magnetic field generating means includes at least three physically separate magnetic field generators for generating said magnetic field which includes three magnetic fields.

8. A thin film apparatus, comprising:
a crucible for holding a substance for deposition having an opening at a top portion;
a heating means for heating the crucible to vaporize the substance therein;
an ionization filament, disposed above the opening of the crucible, for generating electrons for ionizing clusters of the vaporized substance;
an anode surrounding the ionization filament, the crucible and the heating means, the anode having a positively charged voltage relative to the ionization filament to attract the electrons generated by the ionization filament and cause the generated electrons to collide with the vaporized substance;

an acceleration means, disposed above the ionization filament, for drawing ionized clusters of the vaporized substance towards a substrate for receiving the ionized clusters of the vaporized substance; and a magnetic field generating means, disposed circumferentially around the ionization filament, for generating a magnetic field on the electrons generated by the ionization filament, the direction of the magnetic field being substantially perpendicular to a direction of an electric field between the ionization filament and the anode.

9. An apparatus according to claim 8, wherein an electric field is generated between the ionization filament and the anode, the direction of the generated electric field being substantially perpendicular to a line between a central portion of the ionization filament and the opening in the crucible.

10. An apparatus according to claim 8, wherein:
said magnetic field generating means includes at least three physically separate magnetic field generators for generating said magnetic field which includes three magnetic fields.

11. A thin film apparatus, comprising:
a crucible for holding a substance for deposition having an opening at a top portion;
a heating means for heating the crucible and vaporizing the substance therein;
an ionization means for generating electrons for ionizing clusters of the vaporized substance;
anode means, disposed circumferentially around the ionization means, for attracting the electrons generated by the ionization means and causing the generated electrons to collide with the vaporized substance, the anode means and ionization means forming an electrical field which moves the electrons generated by the ionization means towards the anode means; and
an acceleration means, disposed above the ionization means, for drawing ionized clusters of the vaporized substance towards a substrate for receiving the ionized clusters of the vaporized substance.

12. An apparatus according to claim 11, further comprising:
a magnetic field generating means, disposed circumferentially around the ionization means, for generating a magnetic field on the electrons generated by the ionization means, the direction of the magnetic field being substantially perpendicular to a direction of the electric field between the ionization means and the anode means.

13. An apparatus according to claim 11, wherein:
the ionization means and the anode means and the electric field generated thereby cause electrons emitted from the ionization means to drift away from a central ionization area towards the anode means and collide with the vaporized substance between the anode means and ionization means.

14. An apparatus according to claim 11, wherein a first direction is defined to be between the opening in the crucible and a center portion of the ionization means, and wherein the electric field between the ionization means and the anode means is substantially perpendicular to said first direction.

15. A thin film apparatus, comprising:
a crucible for holding a substance for deposition having an opening at a top portion;

a heating means for heating the crucible and vaporizing the substance therein;

an ionization means for generating electrons for ionizing clusters of the vaporized substance;

anode means, disposed circumferentially around the ionization means, for attracting the electrons generated by the ionization means and causing the generated electrons to collide with the vaporized substance, the anode means and ionization means forming an electrical field which moves the electrons generated by the ionization means towards the anode means;

an acceleration means, disposed above the ionization means, for drawing ionized clusters of the vaporized substance towards a substrate for receiving the ionized clusters of the vaporized substance; and a magnetic field generating means, disposed circumferentially around the ionization means, for generating a magnetic field on the electrons generated by the ionization means, the direction of the magnetic field being substantially perpendicular to a direction of the electric field between the ionization means and the anode means;

wherein said magnetic field generating means includes at least three physically separate magnetic field generators for generating said magnetic field which includes three magnetic fields.

16. An apparatus according to claim 15, wherein:

the ionization means and the anode means and the electric field generated thereby cause electrons emitted from the ionization means to drift away from a central ionization area towards the anode means and collide with the vaporized substance between the anode means and ionization means.

17. An apparatus according to claim 15, wherein a first direction is defined to be between the opening in the crucible and a center portion of the ionization means, and wherein the electric field between the ionization means and the anode means is substantially perpendicular to said first direction.

* * * * *